United States Patent [19]

Deie

[11] Patent Number: 4,592,131

[45] Date of Patent: Jun. 3, 1986

[54] METHOD FOR MANUFACTURING RESIN-SEALED SEMICONDUCTOR DEVICE

[75] Inventor: Toshikazu Deie, Aioi, Japan

[73] Assignee: Kabushiki Kaisha Toshiba, Japan

[21] Appl. No.: 682,841

[22] Filed: Dec. 18, 1984

[30] Foreign Application Priority Data

Feb. 22, 1984 [JP] Japan ................................ 59-32069

[51] Int. Cl.⁴ ........................................... H01L 21/56
[52] U.S. Cl. ........................................ 29/588; 29/591;
 174/52 PE; 357/70; 357/72; 83/914; 264/161;
 264/272.17; 264/276; 264/344
[58] Field of Search ...................... 29/576 S, 588, 591;
 174/52 PE; 264/161, 272.15, 272.17, 276, 344;
 357/70, 72; 83/914

[56] References Cited

U.S. PATENT DOCUMENTS 3,539,675 11/1970 Hugill ............................. 264/276 X
4,451,973 6/1984 Tateno et al. .............. 264/272.17 X

FOREIGN PATENT DOCUMENTS 55-49966 12/1980 Japan .............................. 264/272.17

Primary Examiner—Brian E. Hearn
Assistant Examiner—Alan E. Schiavelli
Attorney, Agent, or Firm—Finnegan, Henderson, Farabow, Garrett & Dunner

[57] ABSTRACT

A method for manufacturing a resin-sealed semiconductor device wherein after a semiconductor pellet is sealed to a leadframe with a resin, outer leads projected from the leadframe and adhered with burrs are collapsed by their upper or upper and lower corners and then the burrs are removed by blasting.

6 Claims, 18 Drawing Figures

METHOD FOR MANUFACTURING RESIN-SEALED SEMICONDUCTOR DEVICE

BACKGROUND OF THE INVENTION (a) Field of the Invention

The present invention relates to a method for manufacturing a resin-sealed semiconductor device mounted on a circuit substrate of a hybrid IC and, more particularly, to a method for treating outer leads of the semiconductor device after sealing the semiconductor device with resin.

(b) Description of the Prior Art

The conventional resin-sealed semiconductor device mounted on a circuit substrate of a hybrid IC has been manufactured as follows.

A pellet which has been formed was first fastened onto a bed of a leadframe formed by punching a metal plate. A bonding pad of the pellet and the inner lead portion of the leadframe were then electrically connected by wire bonding.

Subsequently, the pellet and the inner lead portion of the leadframe in which the pellet are arranged are sealed by resin using molding dies. Thus, as shown in FIG. 1, the resin sealer 11 for containing the pellet is formed integrally with the leadframe 12. In the step of sealing with resin, the molding resin 13 flows out from the gap of the molding dies, adheres to the surface of the outer leads 12a and cures. FIG. 2 is a sectional view, taken along the line A—A' in FIG. 1. As shown in FIG. 2, since the outer leads 12a make contact on the upper and lower surfaces with the dies, the amount of the resin 13 leaked and adhered to the upper and lower sufaces of the outer leads 12a is extremely small. However, since the outer leads 12a make less contact on the sides with the dies, the resin 13 thickly adheres to the sides.

In order to, therefore, remove the resin 13 adhered to the outer leads 12a, a blasting with particles must be executed.

Then, the outer leads 12a are plated, for example, by soldering, and the unnecessary frame of the leadframe 12 is cut out to manufacture a product.

However, in the conventional blasting step, it was frequently difficult to completely remove the resin 13 adhered to the sides of the outer leads 12a.

Thus, when the outer leads 12a are plated in the next step, the outer leads 12a, from which the resin 13 on the sides is removed, are covered by a plating 14 on the entire periphery as shown in FIG. 3. However, the outer leads 12a, to which the resin is adhered on the sides, are plated only on the upper and lower surfaces as shown in FIG. 4. Therefore, the outer leads 12a shown in FIG. 3 are preferably bonded to a circuit substrate when mounted on the circuit substrate as shown in FIG. 5. However, the outer leads 12a shown in FIG. 4 are bonded to the circuit substrate in small adhering area as shown in FIG. 6, thereby causing the outer leads 12a to be improperly adhered to the circuit substrate. In FIGS. 5 and 6, reference numeral 15 designates a circuit substrate, and reference numeral 16 is a soldering material.

In case the leadframe 12 is formed by punching, even if the outer leads 12a having burrs 12a', 12a' as shown in FIG. 7 are covered by plating 14, a soldering material 16 is prevented from being fastened onto the outer leads 12a as shown in FIG. 8 when the outer leads 12a are mounted on the circuit substrate 15, thereby feasibly causing the outer leads 12a to be incompletely bonded to the circuit substrate 15.

SUMMARY OF THE INVENTION

The present invention has been made in consideration of this and has for its object to provide a method for manufacturing a resin-sealed semiconductor device according to which, resin adhered onto the sides of outer leads can be reliably removed, a soldering material can be preferably fastened onto the upper sufaces of the outer leads at the time of mounting on a circuit substrate, and the outer leads can be reliably mounted on the circuit substrate.

According to an aspect of the present invention, there is provided a method for manufacturing a resin-sealed semiconductor device which is fastened to a leadframe including the steps of (i) sealing the device, including the portion of the leadframe to which it is fastened, with resin;

(ii) after the sealing step collapsing a pair of adjacent corners of the outer lead members of the leadframe; and (iii) removing resin which adhered during the sealing step to the outer lead members.

BRIEF DESCRIPTION OF THE PREFERRED EMBODIMENTS

An embodiment of a method for manufacturing a resin-sealed semiconductor device according to the present invention will be described in detail with reference to the accompanying drawings.

Figure 1:
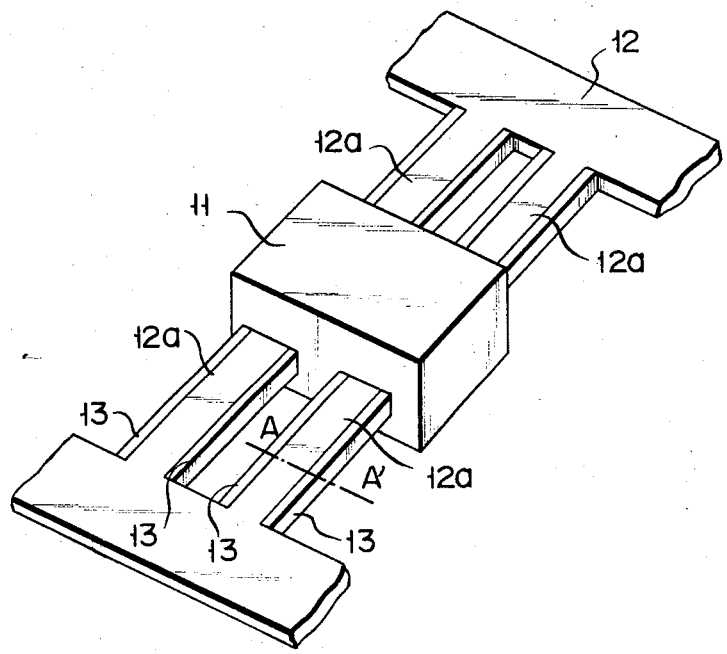
FIG. 1 is a perspective view showing the state of a semiconductor device immediately after the device is sealed with resin.
Figure 2:
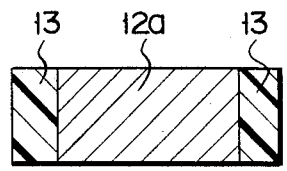
FIG. 2 is a sectional view, taken along the line A—A' of FIG. 1.
Figure 3:
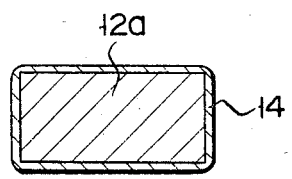
FIGS. 3 and 4 are sectional views of leads plated on the outer surfaces.
Figure 4:
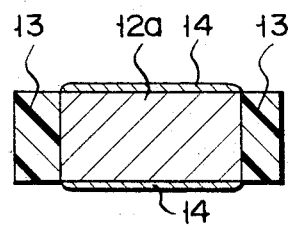
Figure 5:
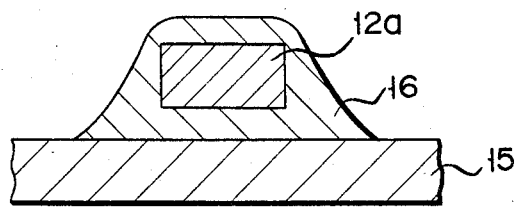
FIGS. 5 and 6 are sectional views showing the leads of FIGS. 3 and 4 soldered to the leadframe.
Figure 6:
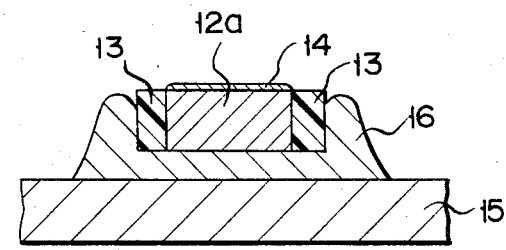
Figure 7:
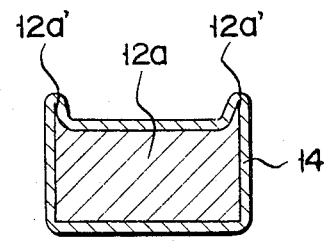
FIG. 7 is a sectional view showing the plating on a lead which has been formed in a punching operation.
Figure 8:
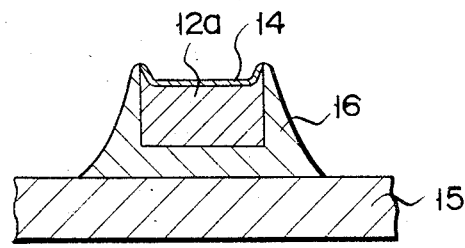
FIG. 8 is a sectional view showing the lead of FIG. 7 soldered to the leadframe.

A pellet is arranged on a leadframe in the same steps as conventional steps, and the pellet and a predetermined position of the leadframe are connected by a bonding wire. Subsequently, the step of sealing with resin using molds is performed in the same manner as the conventional step, thereby forming a semiconductor device as shown in FIG. 1 as described above.

Figure 9A:
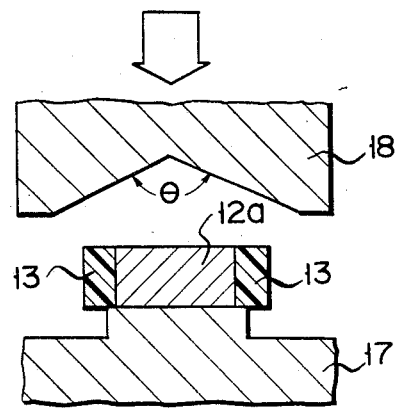
FIGS. 9(A) and 9(B) are sectional views showing the step of collapsing the corners of the lead according to the present invention.
Figure 9B:
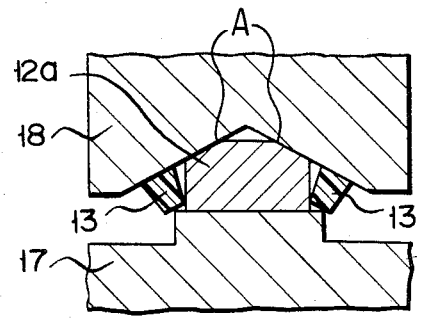
Figure 10:
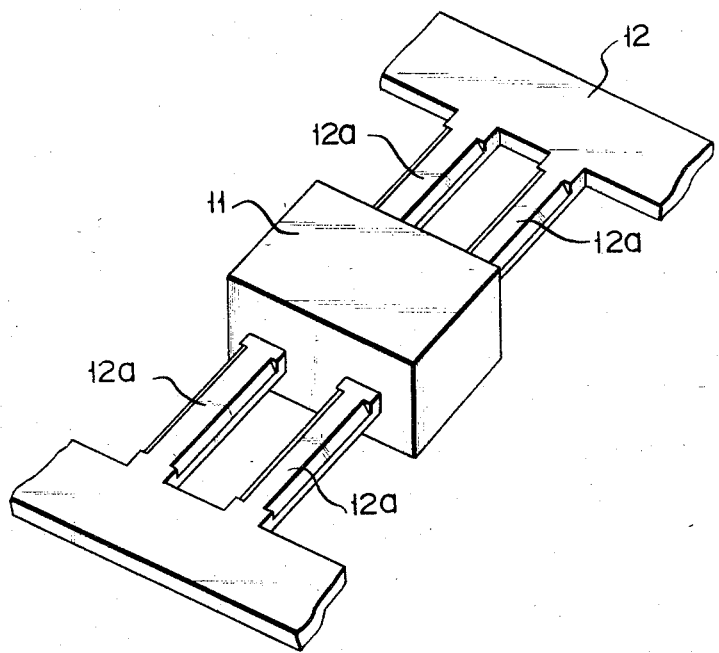
FIG. 10 is a perspective view of a resin-sealed semiconductor device obtained by the method of FIGS. 9(A) and 9(B)

Then, as shown in FIG. 9(A), an outer lead 12a of the above device is placed on the lower die member 17. A die member 18 having a V-shaped concave pressing surface with a predetermined opening angle $\theta$ is lowered by an air press from above in a direction as designated by an arrow in FIG. 9(A) to collapse at least the part to be brazed of the lead 12a. Thus, as shown in FIG. 9(B), both upper corners of the lead 12a along the longitudinal direction are collapsed, and plastically deformed, thereby forming collapsed areas A which form obtuse angles between the upper surface and the side surfaces of the lead 12a. Further, resin 13 adhered to the side surface of the lead 12a is effected by a force in an exfoliating direction, and exfoliated at part of the resin 13. Then, the resin adhered to the side surface of the lead 12a is completely removed by a blasting step. The external appearance of the device in this state is shown in FIG. 10. Subsequently, the unnecessary frame part of the frame 12 is cut, and the device is then soldered and plated as required, thereby producing a final product.

Figure 11A:
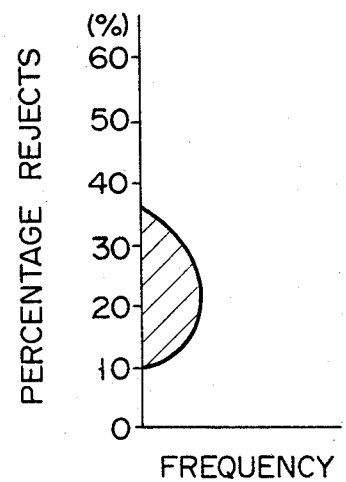
FIG. 11(A) is a graph showing the reject rate of semiconductor due to residual resin left in conventional sealing methods.
Figure 11B:
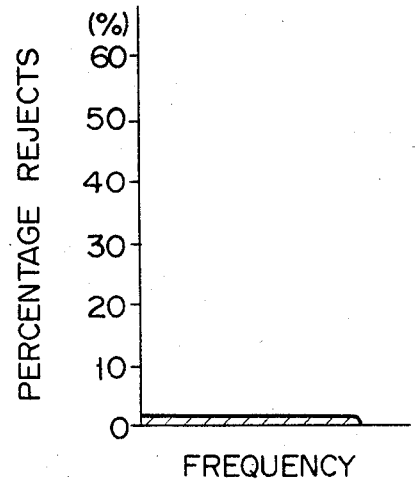
FIG. 11(B) is a graph showing the reject rate of semiconductor devices manufactured according to the method of the present invention.

In the method described above, the outer lead 12a is plastically deformed, and the resin 13 is removed in the blasting step in the state that the resin 13 of the side surface is exfoliated. Therefore, the resin 13 can be reliably removed. Thus, the lead 12a can be soldered or plated on the entire periphery. Consequently, an improper mounting of the device on a circuit board can be reduced, thereby remarkably improving the reliability. Further, the malfunction occurrence rate due to the remaining resin after the blasting step is approx. 15 to 30% as shown in the hatched portion in FIG. 11(A) in the conventional one, but can be reduced substantially to 0% as shown in FIG. 11(B) in the method according to the present invention.

Figure 12:
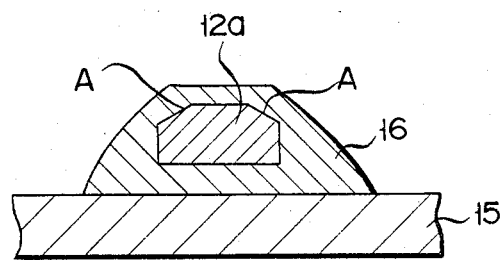
FIG. 12 is a sectional view showing the mounted state of the outer leads of FIG. 10 on a circuit substrate.

In the present invention as described above, the burr of the outer lead at the pressing step can be collapsed. Therefore, as shown in FIG. 12, creeping of a brazing material 16 on the lead 12a at the mounting on a circuit board 15 can be improved, thereby providing, preferably a mounting state.

Further, to readily and completely exfoliate the resin 13 adhered on the side surface of the lead 12a in the blasting step, both lower corners of the lead 12a may also be collapsed by the above-described means.

Figure 13:
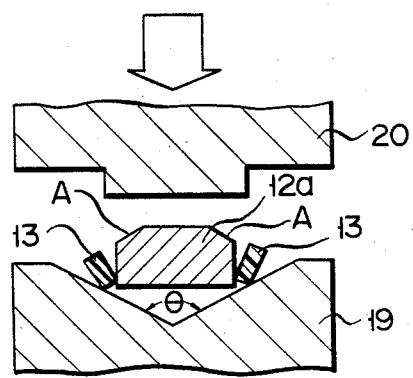
FIGS. 13 and 14 are sectional views illustrating another embodiment of the method according to the present invention.

More particularly, after the collapsing step shown in FIG. 9(B), the lead 12a in which both upper corners are plastically deformed, is placed on a lower mold 19 as an outer lead bearer having an opening angle $\theta$ as shown in FIG. 13. Then, an upper mold 20 is lowered from above, and the lead 12a is pressed to the mold 19.

Figure 14:
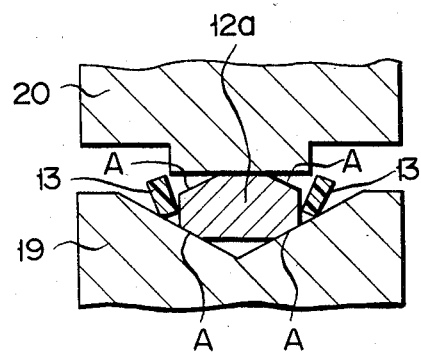

Thus, as shown in FIG. 14, both lower corners of the lead 12a are plastically deformed to form collapsed areas A. Further, the resin 13 adhered to the side surface of the lead 12a is exfoliated.

Figure 15:
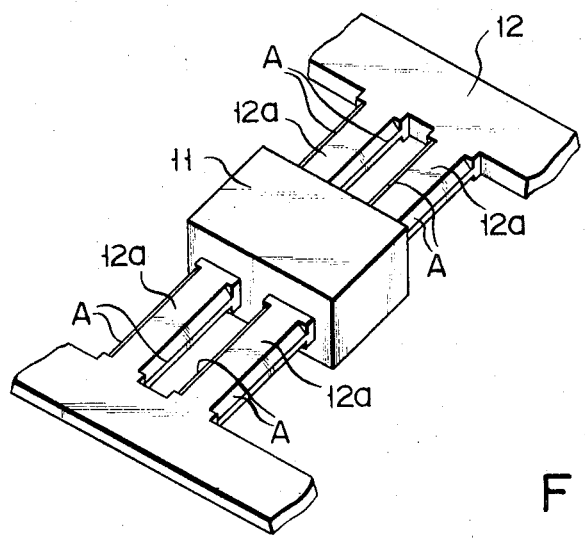
FIG. 15 is a perspective view of a resin-sealed semiconductor device obtained according to the method of FIGS. 13 and 14.

Then, the resin adhered to the lead 12a is completely removed in the blasting step, and the device in which no resin remains on the leads 12a is formed as shown in FIG. 15. Subsequently, the unnecessary frame part of the leadframe 12 is cut, and the device is soldered and plated in the same manner as described above, thereby providing a product.

According to the present invention as described above, the resin adhered to the outer leads can be substantially completely removed and a method for manufacturing a resin-sealed semiconductor device in which flowing of the brazing material on the outer leads is improved, and the leads can be reliably mounted on a circuit board in high reliability can be provided.

Figure 16:
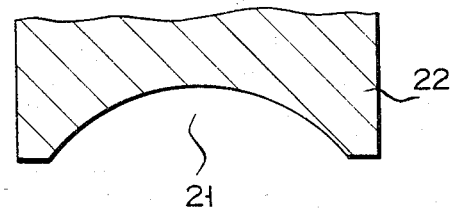
FIG. 16 is a sectional view of a press used in a method according to still another embodiment of the present invention.

In the embodiment described above, the step of pressing the outer lead 12a to form collapsed areas A is performed by placing the lead 12a on a punch having a V-shaped groove including an angle $\theta$. However, the step is not limited to the particular embodiment described above. For example, other arbitrary means such as a punch 22 having an arc-shaped, concave pressing surface formed with an arcuate groove 21 as shown in FIG. 16 may be used.

What is claimed is:

1. A method for manufacturing a sealed semiconductor-containing element fastened to a leadframe having outer lead members comprising the steps of:
   (i) sealing said element, and the portion of said leadframe to which said element is fastened, with resin;
   (ii) after said sealing step collapsing a pair of adjacent corners of said outer lead members in the longitudinal direction along said members, said adjacent corners both being coplanar with either the top or bottom plane of said leadframe; and
   (iii) removing resin which adhered during the sealing step to the sides of said outer lead members.

2. The method of claim 1 comprising the additional step of collapsing an additional pair of adjacent corners on said lead members opposite said first pair of adjacent corners.

3. The method of claim 1 wherein said collapsing step removes a portion of the resin adhered to the sides of said outer lead members.

4. The method of claim 1 wherein said collapsing step is performed using a die having a concave pressing surface.

5. The method of claim 4 wherein said die surface is V-shaped.

6. The method of claim 4 wherein said die surface is arc-shaped.

* * * * *